United States Patent
McGill et al.

(10) Patent No.: US 6,987,286 B2
(45) Date of Patent: Jan. 17, 2006

(54) YELLOW-GREEN EPITAXIAL TRANSPARENT SUBSTRATE-LEDS AND LASERS BASED ON A STRAINED-INGAP QUANTUM WELL GROWN ON AN INDIRECT BANDGAP SUBSTRATE

(75) Inventors: Lisa McGill, Quincy, MA (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/632,442

(22) Filed: Aug. 1, 2003

(65) Prior Publication Data

US 2004/0099872 A1    May 27, 2004

Related U.S. Application Data

(60) Provisional application No. 60/400,754, filed on Aug. 2, 2002.

(51) Int. Cl.
*H01L 33/00* (2006.01)

(52) U.S. Cl. .............................. 257/97; 257/99; 257/13

(58) Field of Classification Search .................. 257/97, 257/99, 13
See application file for complete search history.

(56) References Cited

U.S. PATENT DOCUMENTS

| | | | |
|---|---|---|---|
| 5,300,794 A | 4/1994 | Melman et al. | |
| 5,363,392 A | 11/1994 | Kasukawa et al. | |
| 5,557,627 A * | 9/1996 | Schneider et al. | ............ 372/46 |
| 5,751,753 A | 5/1998 | Uchida | |
| 6,064,076 A | 5/2000 | Chen et al. | |
| 6,081,540 A | 6/2000 | Nakatsu | |
| 6,108,360 A | 8/2000 | Razeghi | |
| 6,278,136 B1 * | 8/2001 | Nitta | ............................ 257/99 |
| 6,433,364 B2 | 8/2002 | Hosoba et al. | |
| 2001/0028061 A1 | 10/2001 | Hosoba et al. | |

OTHER PUBLICATIONS

"Evolution of microstructure and dislocation dynamics in $In_xGa_{1-x}P$ graded Buffers grown on GaP by metalorganic vapor phase epitaxy: engineering device-quality substrate materials," Kim et al. *J. Vac. Sci. Technol. B.* Jul./Aug. 1999. vol. 17.

"Yellow-Green emission for ETS-LEDs and Lasers based on a strained InGaP quantum well heterostructure grown on a transparent, compositionally graded AlInGaP buffer," McGill et al. *Mat. Res. Soc. Symp.* 2003: vol. 744.

"Gas-Source Molecular Beam Epitaxial Growth, Characterization, and Light-Emitting diode application of $In_xGa_{1-x}$ P on GaP(100)," Chin et al. *Applied Physics Letters.* May 1993. vol. 62, No. 19.

"Highly Strained $In_xGa_{1-x}$ P/GaP Quantum Wells Grown on GaP and on an $In_{x/2}Ga_{1-x/2}P$ Buffer Layer by Gas-Source Molecular Beam Epitaxy," Bi et al. *Journal of Crystal Growth.* 1996. vol. 165.

(Continued)

*Primary Examiner*—Jerome Jackson
(74) *Attorney, Agent, or Firm*—Gauthier & Connors LLP

(57) ABSTRACT

A light-emitter structure is provided. The light emitter structure includes a platform. An $In_x(Al_yGa_{1-y})_{1-x}P$ lower clad region is formed on the platform and has a lattice constant between approximately 5.49 Å and 5.62 Å. A strained quantum-well active region is formed on the lower clad region. An $In_x(Al_yGa_{1-y})_{1-x}P$ upper clad region is formed on the strained quantum well active region.

22 Claims, 14 Drawing Sheets

OTHER PUBLICATIONS

"Growth and Characterization of InGaP Yellow-Green Light-Emitting Diodes by Liquid-Phase Epitaxy," Chen et al. *Japanese Journal of Applied Physics*. Jan. 1992. vol. 31.

"High-Efficiency InGaP Light-Emitting Diodes on GaP Substrates," Stinson et al. *Applied Physics Letters*. May 1991. vol. 58, No. 18.

"AlGaInP/GaInP Double-Heterostructure Orange Light-Emitting Diodes on GaAsP Substrates Prepared by Metalorganic Vapor-Phase Epitaxy," Lin et al. *Journal of Crystal Growth*. 1994. vol. 137.

"Metalorganic Vapor Phase Epitaxy Growth and Characterization of $(Al_xGa_{1-x})_{0.5}In_{0.5}P/Ga_{0.5}In_{0.5}P$ (x=0.4, 0.7, and 1.0) Quantum Wells on 15°-Off-(100) GaAs Substrates at High Growth Rate," Jou et al. *Japanese Journal of Applied Physics*. Oct. 1993. vol. 32, No. 10.

"Yellow-Green Emission for ETS-LEDs and lasers based on a strained -InGaP quantum well heterostructure grown on a transparent, compositionally graded AlInGaP buffer," McGill et al. *Mat. Res. Symp. Proc.* 2003. vol. 744.

"Growth and Characterization of Lattice-Mismatched $In_xGa_{1-x}P$ Yellow Light Emitting Diodes on GaP," Paul Liu, Phd. Thesis University of Illinois. 1997.

"Metalorganic Vapor Phase Epitaxy Growth and Characterization of $(Al_xGa_{1-x})_{0.5}In_{0.5}P/Ga_{0.5}In_{0.5}P(x=0.4, 0.7, and 1.0)$ Quantum Wells on 15° -Off-(100) GaAs Substrates at High Growth Rate" Jou et al. *Jpn. Journal of Applied Physics*. Oct. 1993. vol. 32, No. 10.

* cited by examiner

|  | AlP | GaP | InP |
|---|---|---|---|
| a (Å) | 5.4672 | 5.4505 | 5.8697 |
| $E_g$ (eV) | 2.45 | 2.26 | 1.35 |
| $E_0$ (eV) | 3.56 | 2.78 | 1.35 |
| n | 3 | 3.02 | 3.1 |

FIG. 2

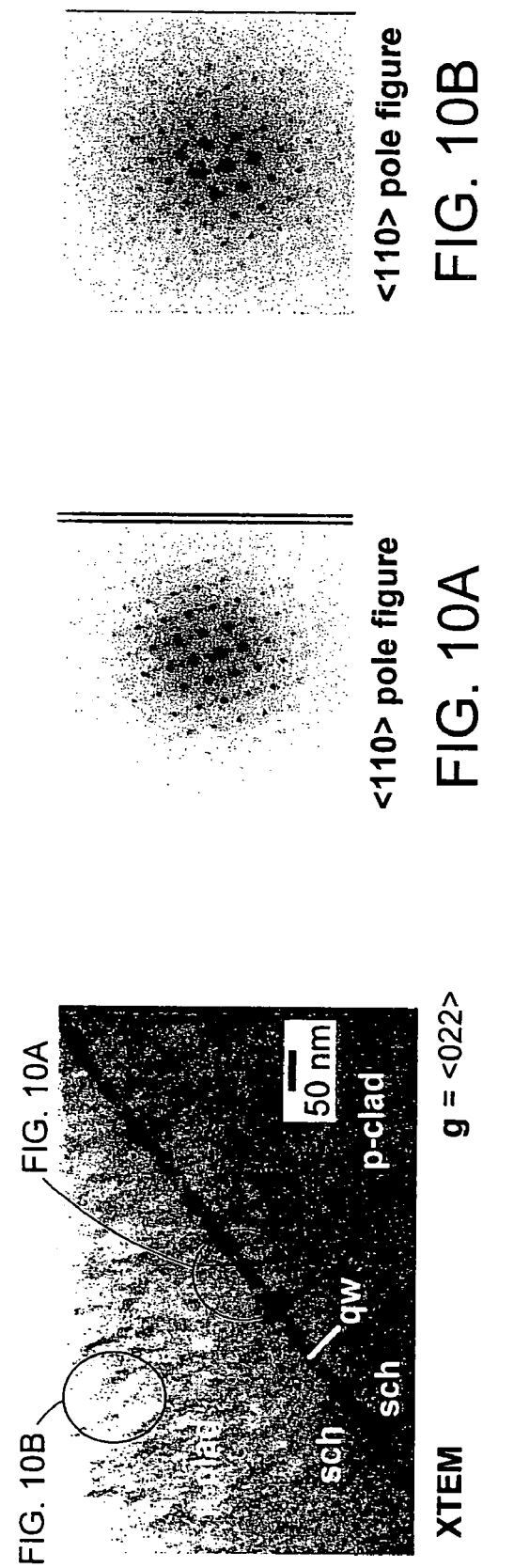

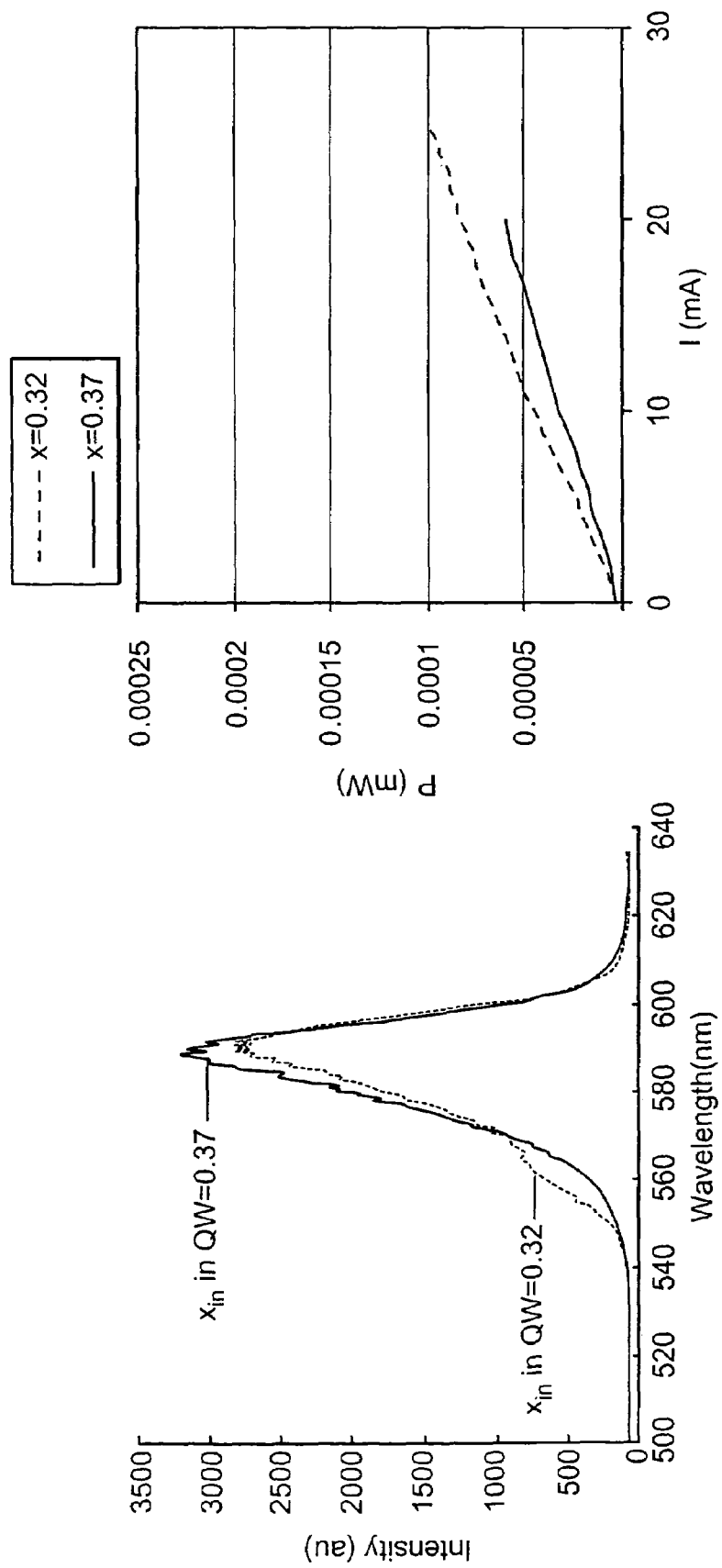

| $x_{qw}$ | $T_{qw}$ (°C) | $\rho_{TDD}(cm^{-2})$ | Peak λ (nm) | Secondary λ (nm) | Power per facet @ 20mA (μW) |
|---|---|---|---|---|---|
| 0.32 | 650 | 7x10$^6$ | 590 | 560 | 0.18 |
| 0.32 | 650 | 5x10$^7$ | 590 | 560 | 0.08 |
| 0.37 | 650 | 5x10$^7$ | 588 | -- | 0.06 |

FIG. 12

YELLOW-GREEN EPITAXIAL TRANSPARENT SUBSTRATE-LEDS AND LASERS BASED ON A STRAINED-INGAP QUANTUM WELL GROWN ON AN INDIRECT BANDGAP SUBSTRATE

PRIORITY INFORMATION

This application claims priority from provisional application Ser. No. 60/400,754 filed Aug. 2, 2002, which is incorporated herein by reference in its entirety.

This invention was made with government support under Grant No. DMR-9820095 awarded by NSF. The government has certain rights in the invention.

BACKGROUND OF THE INVENTION

The invention relates to the field of light-emitting diodes (LEDs), and in particular to yellow-green emission for ETS-LEDs and lasers based on a strained-InGaP quantum well grown on a transparent, compositionally graded AlInGaP buffer.

LED devices are a natural replacement for common incandescent lights and indicators. LEDs are efficient, intense, long-lived and produce little heat. However, the ultimate goal of red-green-blue LED mixing for full-color and white applications has been hindered by the lack of an appropriate green light source. While intense red and blue LEDs are available, various materials issues have prevented the development of a similarly intense green source. These same material issues limit even more strongly the production of solid-state lasers at these wavelengths, particularly in the yellow. There is a need in the art for a LED, based on the InAlGaP semiconductor system, to be used in laser and high-intensity LED devices operating in the wavelength range of 540 nm–590 nm.

SUMMARY OF THE INVENTION

According to one aspect of the invention, there is provided a light-emitter structure. The light emitter structure includes a platform. An $In_x(Al_yGa_{1-y})_{1-x}P$ lower clad region is formed on the platform and having a lattice constant between approximately 5.49 Å and 5.62 Å. A strained quantum-well active region is formed on the lower clad region. An $In_x(Al_yGa_{1-y})_{1-x}P$ upper clad region is formed on the strained quantum well active region.

According to another aspect of the invention, there is provided a method of forming a light-emitter structure. The method includes providing a platform. Also, the method includes forming an $In_x(Al_yGa_{1-y})_{1-x}P$ lower clad region on the platform and having a lattice constant between approximately 5.49 Å and 5.62 Å. A strained quantum-well active region is formed on the lower clad region. Furthermore, the method includes forming an $In_x(Al_yGa_{1-y})_{1-x}P$ upper clad region on the strained quantum well active region.

BRIEF DESCRIPTION OF THE DRAWINGS

FIG. 2 is table demonstrating the lattice constant, bandgap, direct bandgap, and refractive index of an AlP—GaP—InP system;

FIG. 10 is a X-TEM image of a device with an $In_{0.32}Ga_{0.68}P$ quantum well;

FIG. 11 is a graph demonstrating spectral and power per facet characteristics of devices grown at 650° C. with threading dislocation density equal to $5 \times 10^{-7}$ cm$^{-2}$.

FIG. 12 is a table demonstrating the various qualities of the inventive device;

DETAILED DESCRIPTION OF THE INVENTION $In_x(Al_yGa_{1-y})_{1-x}P$ a common visible-light-emitting device material composed of alloys in the fully-miscible AlP—GaP—InP system, is utilized in varying proportions in the inventive design. FIG. 1 shows the relationship between lattice constant and bandgap (the lowest energy separating the conduction band from the valence band) for this materials system. Note that bandgap decreases and lattice constant increases as indium is added to the system. A physical property, a, of any ternary in this system may be determined by linear interpolation from the corresponding binary values: $a(In_xGa_{1-x}P)=x \cdot a(InP)+(1-x) \cdot a(GaP)$. Similarly, for the quaternary, $a[In_x(Al_yGa_{1-y})_{1-x}P]=y \cdot a(In_xAl_{1-x}P)+(1-y) \cdot a(In_xGa_{1-x}P)$. Pertinent materials constants, such as lattice constant (a), bandgap ($E_g$), direct energy gap ($E_o$), and refractive index, (n) for this system are given in FIG. 2.

Of particular importance to the inventive device structure is the behavior of the semiconductor bandgap; carrier recombination across the bandgap, when permitted, results in light emission. It is important to distinguish between bandgap, $E_g$, and direct (k=0) energy gap, $E_o$. In a direct bandgap material, $E_g$ and $E_o$ coincide; the conduction band minimum directly overlies the valence band maximum in momentum space. In an indirect bandgap material, on the other hand, carriers at the conduction band minimum have a different wavevector than those at the valence band maximum.

Direct bandgap materials readily convert electrically generated carriers into photons, while indirect bandgap materials require a phonon interaction that makes light emission improbable. However, even an indirect material may absorb light across its direct energy gap, $E_o$, and this must be considered in the device design. Wavelengths of light that have a higher energy than the direct energy gap will be absorbed, while those with lower energy will be relatively unimpeded.

While AlP and GaP are indirect bandgap semiconductors, InP has a direct bandgap. $In_xAl_{1-x}P$ will remain indirect for $x \leq 0.44$, while $In_xGa_{1-x}P$ will remain indirect for $x \leq 0.27$.

Figure 1:
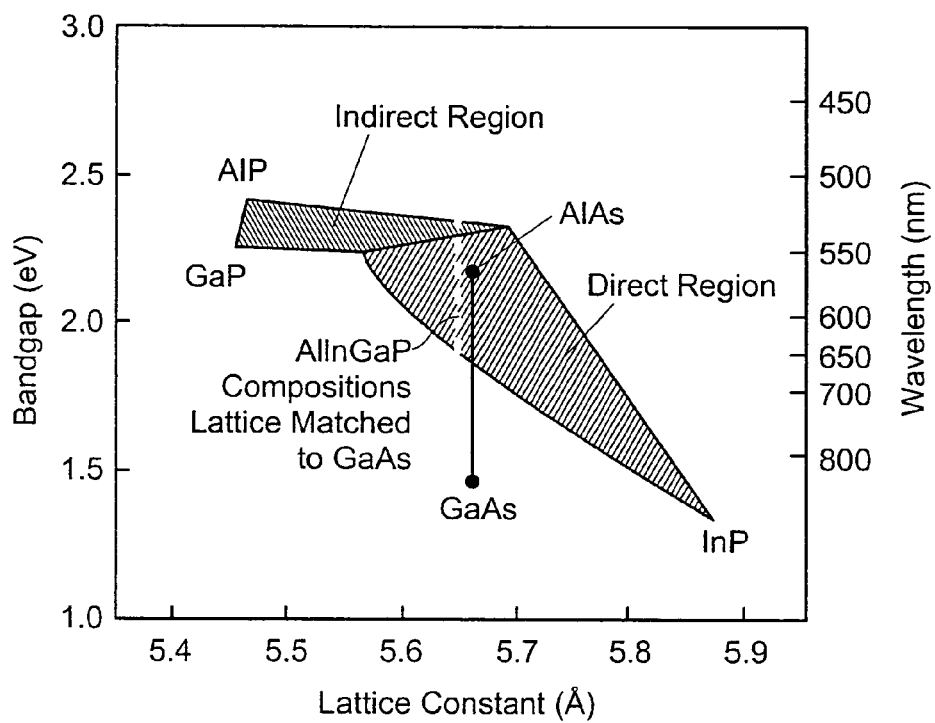
FIG. 1 is a graph demonstrating properties of the AlP—GaP—InP system.

The direct energy gaps of the ternaries have been modeled as follows.

$$E_o(In_xAl_{1-x}P) = 1.351 + 1.83*(1-x) + 0.38*(1-x)^2 \quad \text{Eq. 1}$$

$$E_o(In_xGa_{1-x}P) = 1.351 + 0.643*(1-x) + 0.786*(1-x)^2 \quad \text{Eq. 2}$$

where $E_o = E_g$ for the direct bandgap regime. The indirect energy gap transition may be found via simple linear interpolation between bandgaps of the binary end members, as described herein. Using Eqs. 1 and 2, the values in FIG. 2, and the known composition of the indirect-direct bandgap crossover of the ternary components, FIG. 1 may be transformed into a more convenient coordinate space, shown in FIG. 3. It is possible to see energy gap and lattice constant contours for the entire $In_x(Al_yGa_{1-y})_{1-x}P$ composition space as well as the demarcation between indirect and direct bandgap regimes.

$In_x(Al_yGa_{1-y})_{1-x}P$ LED device fabrication is commonly constrained to deposition on substrates with the same lattice constant as the desired LED composition, often GaAs. Since GaAs absorbs visible wavelengths, the substrate is subsequently removed and the device is wafer bonded to transparent GaP. A monolithically integrated transparent substrate that eliminates the wafer bonding step would improve the economy of the fabrication process.

While GaP and AlP have nearly identical fundamental lattice constants, that of InP is considerably larger. Any composition of AlGaP may be grown on a GaP substrate without introducing significant strain, but the introduction of indium to the alloy will cause compressive strain to build in the epitaxial overlayer. Above a critical thickness, an array of misfit dislocations will nucleate to relieve this strain. Because a dislocation cannot terminate within a crystal, each misfit will be associated with two threading dislocations that travel from the mismatched interface to the film surface, passing through any overlying device region. Since dislocations act as non-radiative recombination sites, a high threading dislocation density in the active region may doom the minority carriers in any light-emitting device.

Through the use of optimized, relaxed graded buffer virtual substrate technology, this lattice-matching constraint has been removed. Beginning with a GaP substrate, a $\nabla_x[In_x(Al_yGa_{1-y})_{1-x}P]$ buffer is deposited in thin layers of increasing indium fraction. Misfit dislocations are nucleated at the first mismatched interface to relieve strain and are then recycled throughout the buffer, obviating the need for further dislocation nucleation. InAlGaP buffers grown in this manner have threading dislocation densities on the order of $10^6$ cm$^{-2}$, low enough for quality light-emitting devices. When the desired final composition is reached a thick cap layer is grown, and device layers may be grown on top of this cap. In this way, an epitaxially integrated, fully transparent substrate is provided for the device active region, as will be described hereinafter.

Figure 3:
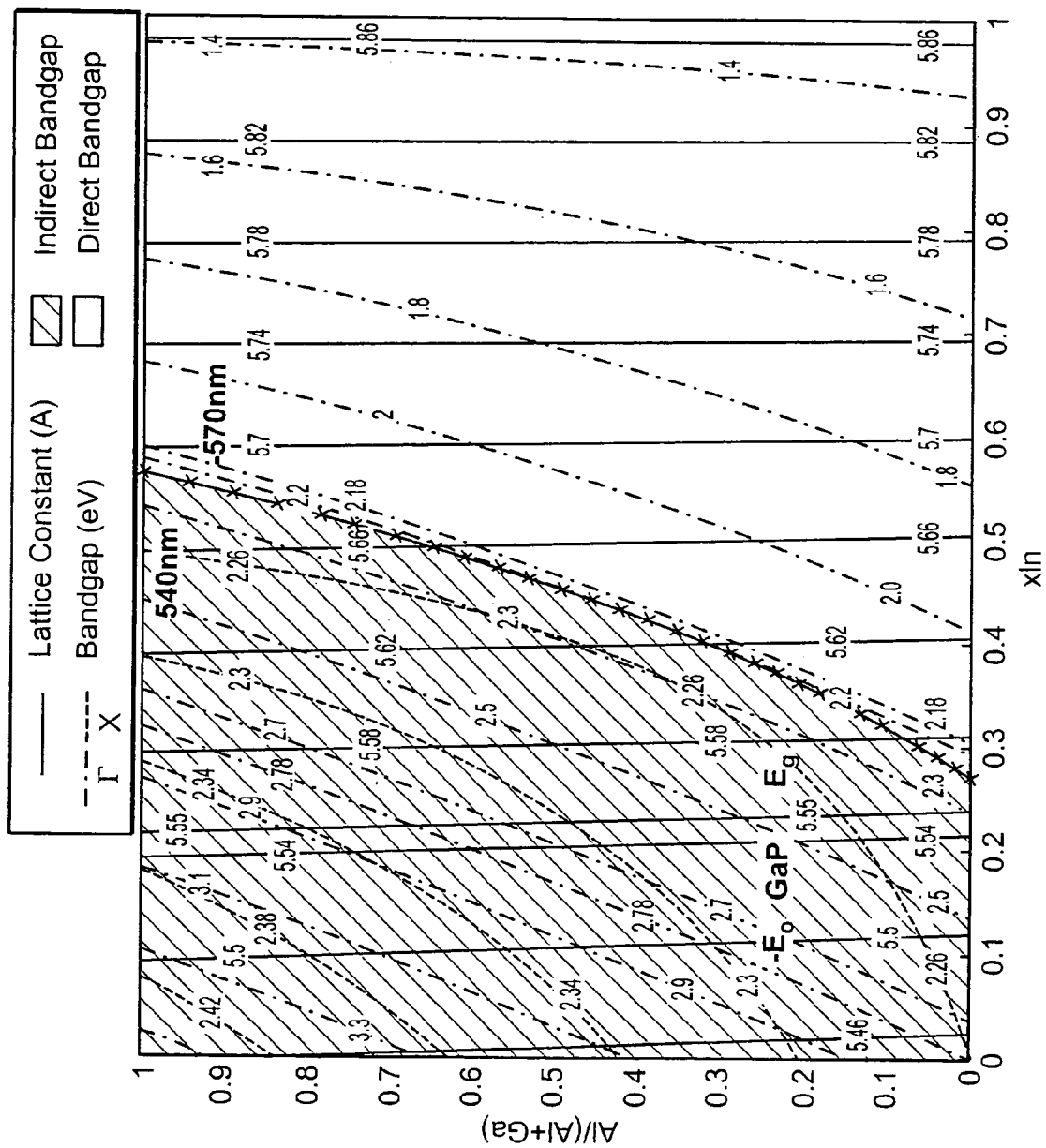
FIG. 3 is graph demonstrating the lattice constant, bandgap, and direct bandgap contours for an InAlGaP system.
Figure 4:
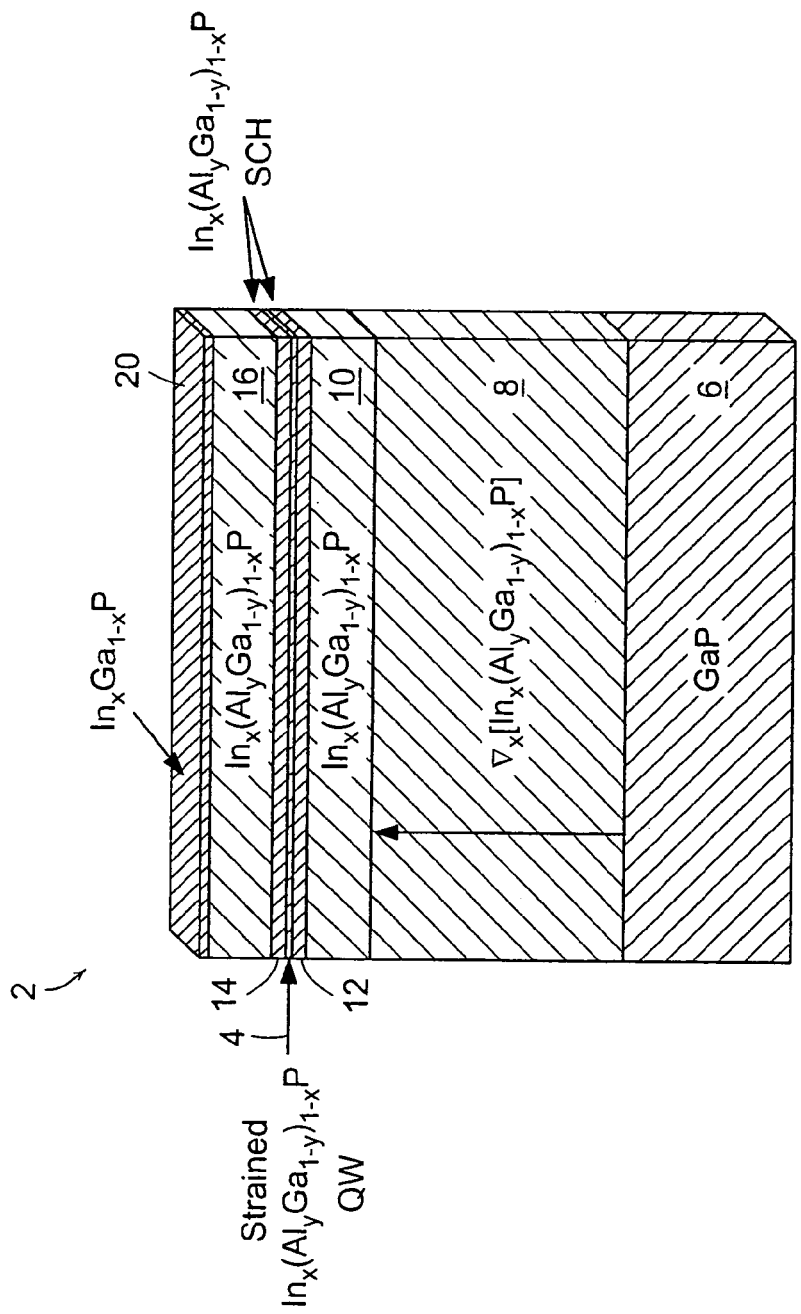
FIG. 4 is a schematic block diagram of the inventive light-emitter structure design.

FIG. 4 is a schematic block diagram of a device 2 in accordance with the invention. A strained quantum-well active region 4 is utilized for its expected decrease in emission wavelength and increase in efficiency. FIG. 3 provides a complete guide to the lattice constant, bandgap, and (if different from the bandgap) direct energy gap throughout the InAlGaP system. Using FIG. 3 it becomes straightforward to engineer a virtual substrate for the device 2 that provides the appropriate amount of strain and will not absorb the emitted light.

A n-type, p-type, or undoped $\nabla_x[In_x(Al_yGa_{1-y})_{1-x}P]$ graded buffer 8 is deposited atop a GaP substrate 6 to form a platform. As the indium fraction in the graded buffer 8 increases the bandgap will decrease; the inclusion of aluminum in the graded buffer 8 counters this effect by increasing both $E_g$ and $E_o$, thereby maintaining transparency. A $In_x(Al_yGa_{1-y})_{1-x}P$ layer 10, where $0.1 \leq x \leq 0.4$ and $0 \leq y \leq 1$, is formed on the graded buffer 8, with a lattice constant between approximately 5.49 Å and 5.62 Å, and becomes the lower clad region of the device active layer. The indium fraction in the layer 10 may be varied to suit the desired active region 4 emission energy, and the layer 10 can be n-doped or p-doped. A separate confinement heterostructure 12 (SCH) includes said separate InGaP or InAlGaP that is approximately lattice-matched to the clad layer 10., and is approximately lattice-matched to the underlying layer 10. The strained quantum-well active region 4 comprises of an $In_x(Al_yGa_{1-y})_{1-x}P$ strained quantum-well active region, where x is selected to produce a direct bandgap InGaP alloy in the range of $0.27 \leq x \leq 0.50$ and $0 \leq y \leq 1$. This quantum well composition should not have a lattice constant that exceeds strain levels that would prevent continuous film growth and can either be n-doped or p-doped.

Aluminum can be added to the active region 4 if desired, this will shorten the emission wavelength but will also tend to incorporate oxygen-related defects. A symmetric SCH 14 and upper clad region 16 are repeated above the active region 4. The upper clad region can be p-doped or n-doped, and is approximately lattice-matched to the lower clad region 10 formed on the strained quantum well. The total structure 2 is capped with a thin layer 20 of InGaP to prevent oxidation of the aluminum-containing top clad and provide a contact layer. This layer is sufficiently thin to prevent significant optical effects.

In other embodiments, the use of the graded buffers 8 may not be necessary. A substrate that is approximately lattice-matched to the lower clad region 10 can be used as a platform.

Figure 5:
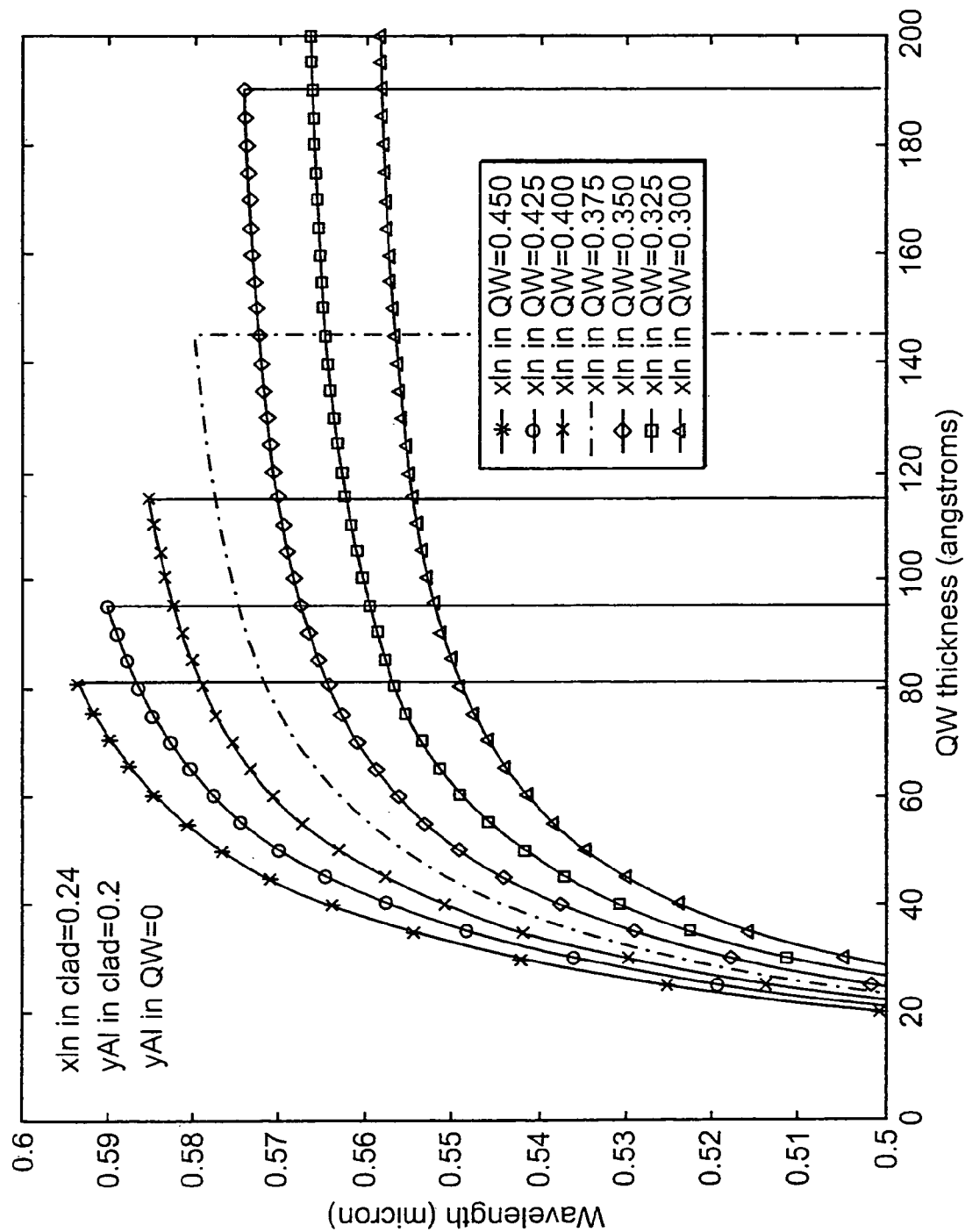
FIG. 5 is a graph demonstrating the predicted emission for sub-critical thickness quantum well structures.

Predicted wavelengths and quantum well critical thicknesses for this design are shown in FIG. 5. The curves shown in FIG. 5 represents a specific concentration, in this case x=0.24 and y=0.2 in the clad. This device design provides for excellent optical and electronic confinement, as shown schematically by the bandgap and refractive index profiles in FIG. 6. Furthermore, this design is easily extendable to multiple quantum well structures for increased intensity.

It is important to note that the active region is the only direct bandgap material in the entire device. Emitted light has an extremely low probability of being absorbed within the cladding or substrate. The direct energy gap, $E_o$, of the clad region is much greater than the energy of the emitted light, while its inherent indirect bandgap has a very low probability for photon interactions. In effect, this structure provides a filly transparent substrate and confinement region for the quantum-well emission. By using direct bandgap, strained quantum-well active regions with low indium fraction, we are theoretically able to produce wavelengths as short as 540 nm (yellow-green/green).

Figure 6:
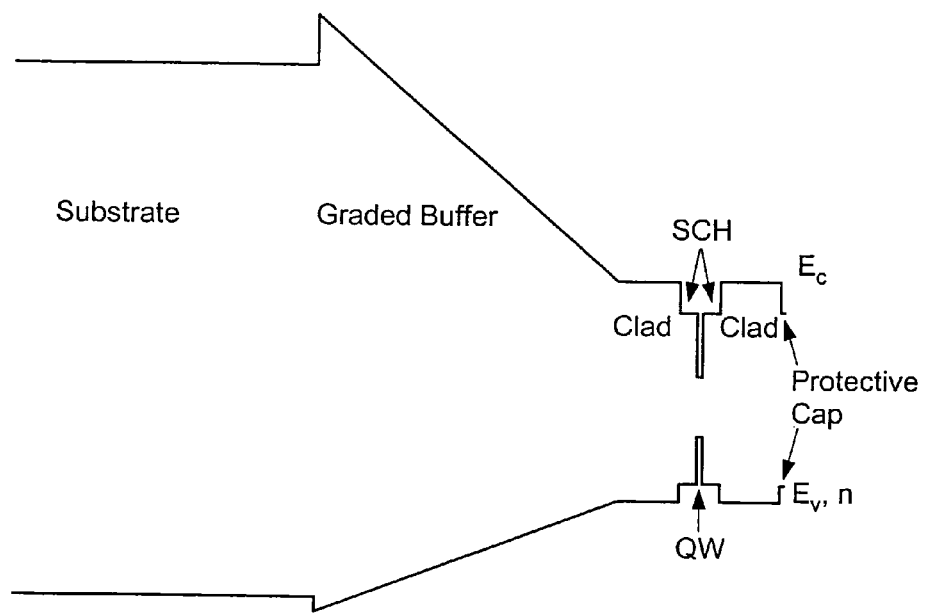
FIG. 6 is a schematic diagram demonstrating variation of bandgap and refractive index in the device.
Figure 7:
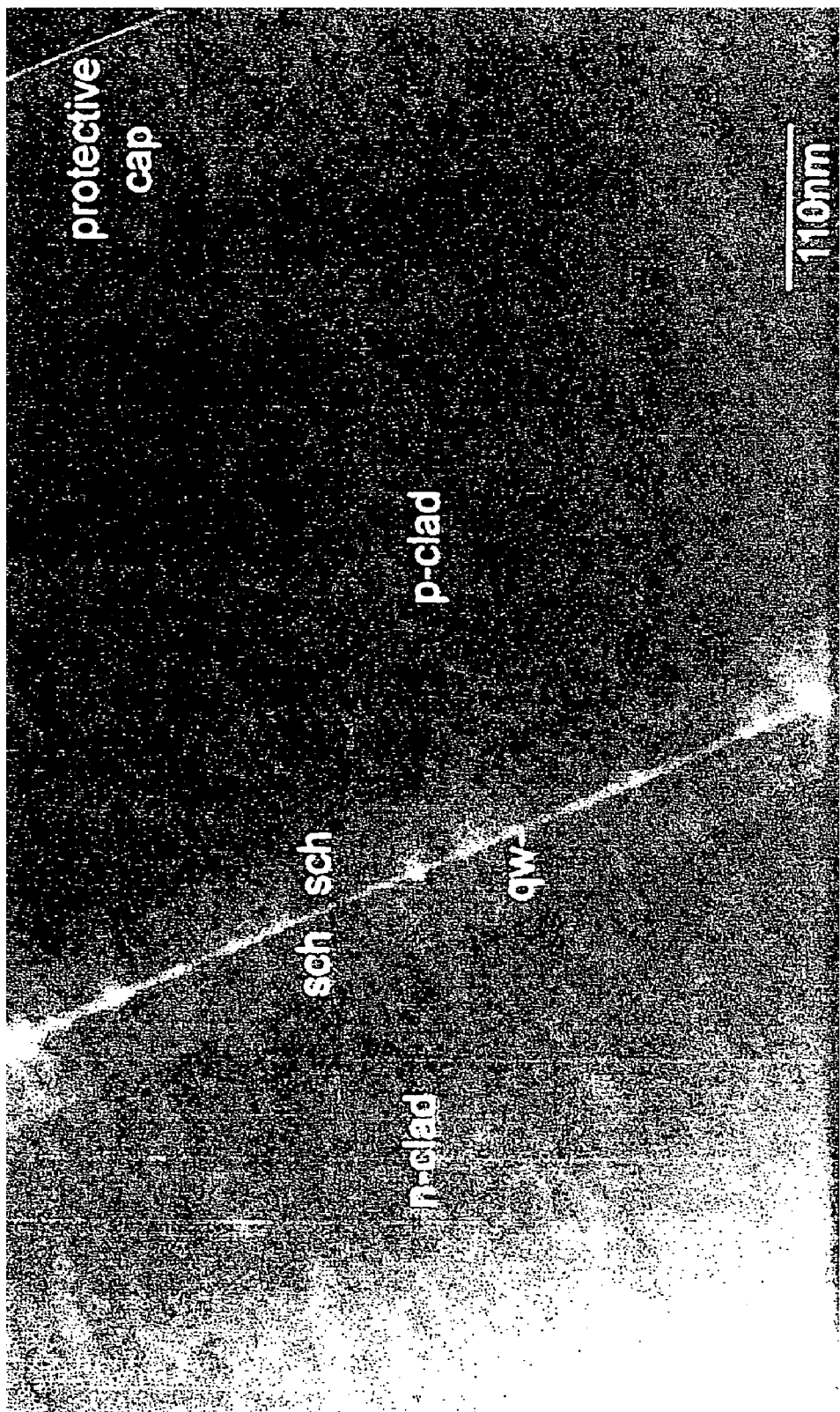
FIG. 7 is a cross-section TEM image of the device region.
Figure 8:
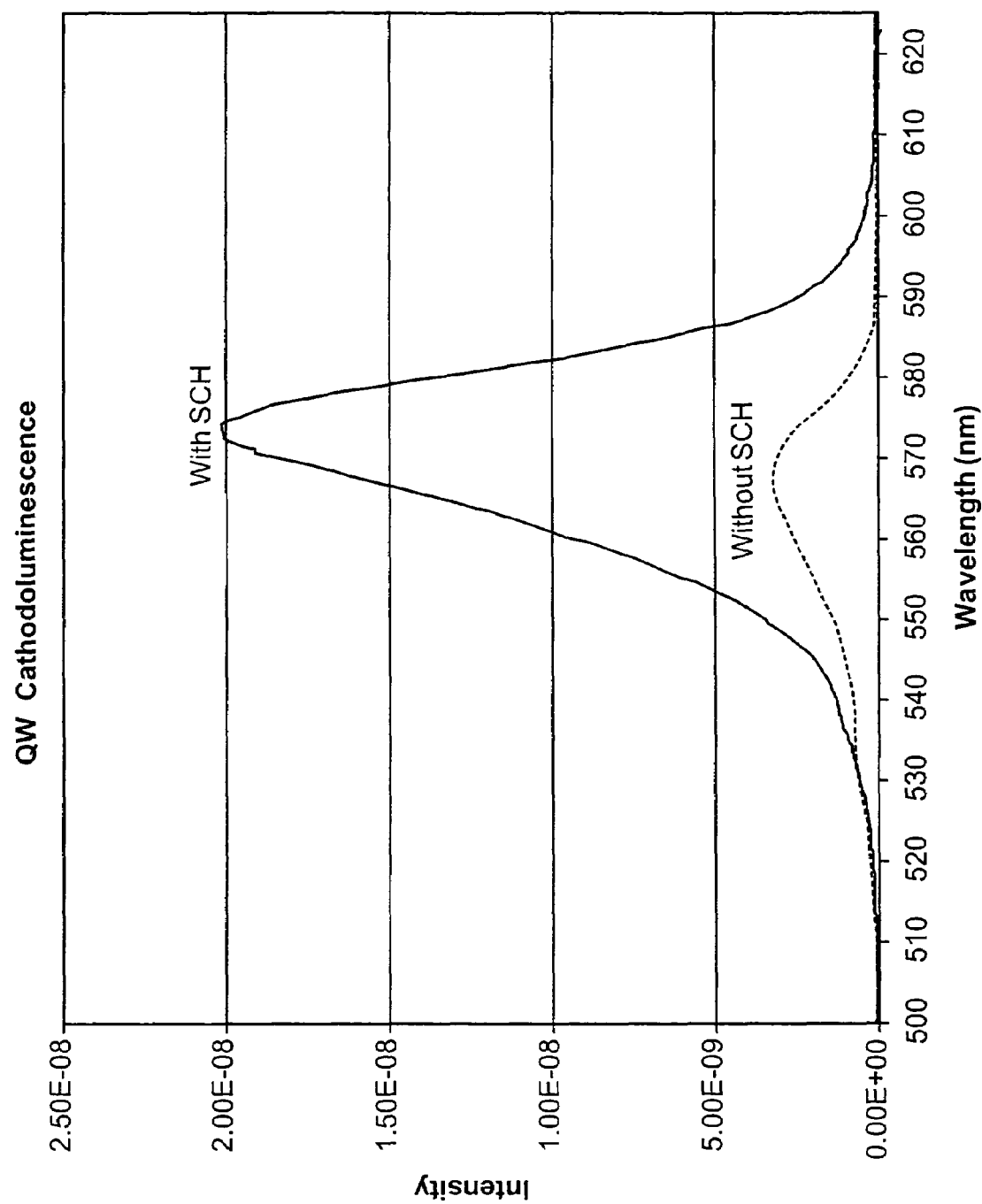
FIG. 8 is a graph demonstrating emission from undoped quantum well structures.

To date, several of these structures have been grown and high material quality has been observed. Cross-section transmission electron microscopy shows a continuous, planar quantum-well region surrounded by clads that are free of microstructural defects, as shown in FIG. 6. Plan view transmission electron microscopy confirms a threading dislocation density on the order of $2 \times 10^6$ cm$^{-2}$. Cathodoluminescence of undoped device structures, both with and without a separate confinement region, shows quantum-well emission at 570 nm, as shown in FIG. 8.

Note the large improvement in emission character with the separate confinement heterostructure. The intensity of this emission, given the small excitation volume and generally weak emission that result from cathodoluminescence, is very promising. LEDs based on this device design have been grown and processed, and yellow light emission has been observed upon testing. Work in the near future will optimize quantum-well strain, doping levels, and contact geometries to produce quality LEDs emitting at the various wavelengths predicted in FIG. 5. Slight variations in device processing will also produce lasers based on the same device structure.

Figures 9A, 9B:
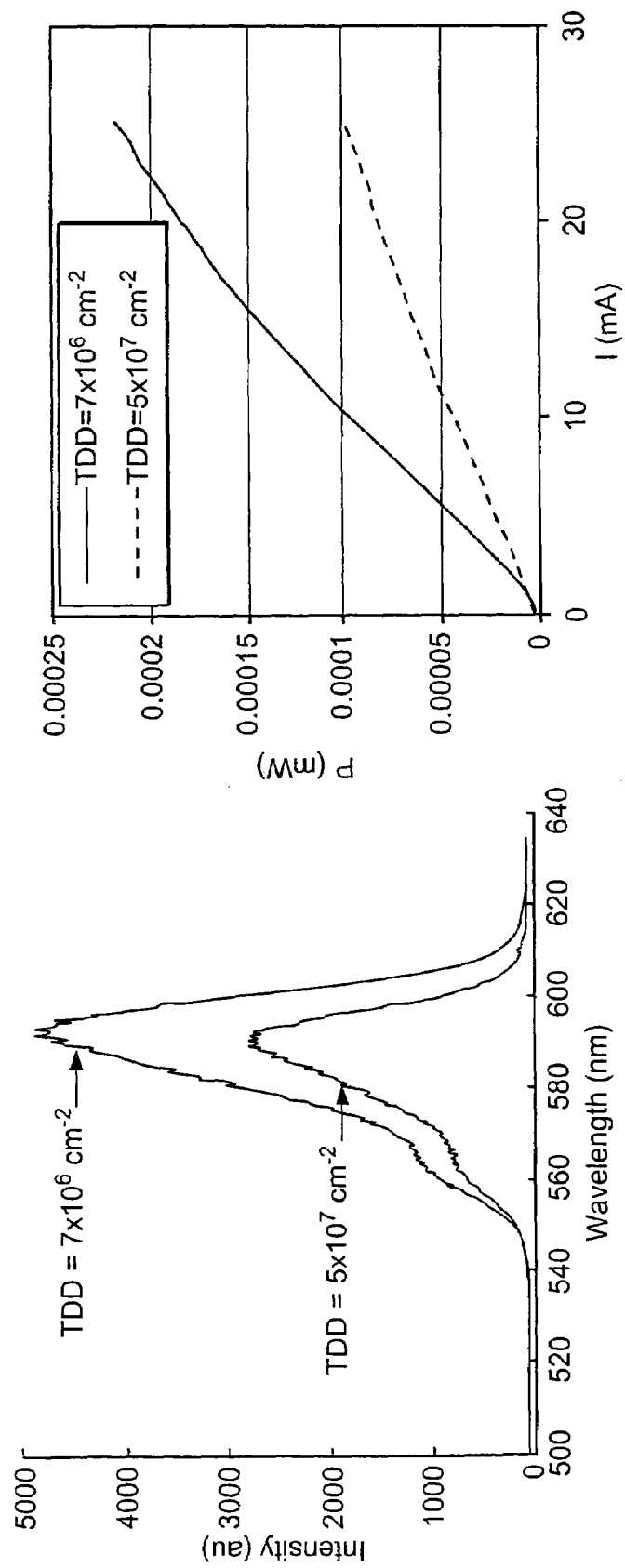
FIG. 9 is a graph demonstrating spectral and power per facet characteristics of devices grown at 650° C.

To explore the impact on device characteristics of indium fraction in the quantum well and bulk threading dislocation density, a series of devices was fabricated. FIG. 9 shows a comparison of the spectral and power characteristics of devices grown at 650° C. with $x_{In}$=0.32 in the quantum well. Device output power at 20 mA increases from 0.08 µW per facet to 0.18 µW per facet as threading dislocation density is decreased by about an order of magnitude, from $5\times10^7$ cm$^{-2}$ to $7\times10^6$ cm$^{-2}$. This dependence is not unexpected, as threading dislocations are known to act as dark recombination centers.

The spectral behavior of these $In_{0.32}Ga_{0.68}P$ quantum well devices is particularly interesting to note, because emission at the predicted wavelength of 560 nm is weak and the device is dominated by emission at 590 nm. This line shape is reproduced for both threading dislocation densities. X-TEM studies reveal a probable mechanism for this discrepancy from the expected wavelength. Superspots indicative of CuPt—B-type ordering are visible in electron diffraction of the quantum well, as shown in FIG. 10. Such ordering is known to decrease the bandgap and thereby increase the emission wavelength of direct materials. Both ordered and disordered domains may be present in the quantum well, giving rise to the two observed peaks. FIG. 10 also shows that the quantum well is approximately 170 Å thick, as opposed to the expected 100 Å, which will increase the emission wavelength.

FIG. 11 shows a comparison of the spectral and power characteristics of devices grown at 650° C. and threading dislocation density of $5\times10^7$ cm$^{-2}$. Device output power at 20 mA increases from 0.06 µW per facet to 0.08 µW per facet as indium fraction in the quantum well is decreased from 0.37 to 0.32. However, this difference falls within the reproducibility of our measurement apparatus, and we can effectively say that power is not strongly impacted by indium fraction in quantum well at these compositions.

The spectrum for the device with $x_{In}$=0.37 in the quantum well shows a single peak at 588 nm, which is higher than the expected wavelength of 575 nm. The shoulder observed for $x_{In}$=0.32 in the quantum well does not appear. Given that only the parameters of the quantum well vary among devices, this is clear evidence that the measured emission is coming from the quantum well, as intended. Observed device characteristics are summarized in FIG. 12.

In other embodiments of the invention, a graded buffer of composition $\nabla_x In_x(Al_yGa_{1-y})_{1-x}P$ can span the lattice constant difference between the GaP substrate and the $In_x(Al_yGa_{1-y})_{1-x}P$ clad. For the measured devices that were described herein, $0 < x_{buffer} < 0.22$, $y_{buffer}$=0.2, $x_{clad}$=0.22, and $y_{clad}$= 0.2. However, in theory, a device with any x and y could be produced, given the restriction that the cap layer of the graded buffer is lattice matched to the clad and SCH. Similarly, while $0.32 < x_{qw} < 0.42$ in the devices herein, $x_{qw}$ could take any value. Certain compositions will work better than others, and some not at all, but any could be attempted.

Doping levels may vary, as long as the junction coincides with the quantum well. Alternative compositions make it possible to achieve different emission wavelengths. Note x refers to indium fraction of a given layer; y refers to aluminum fraction, i.e. Al/(Al+Ga); x and y range from 0 to 1.

In practice, the device of the invention can include simple full-area top and bottom contacts, as shown in FIG. 4, where the device includes contacts comprising p-metal. However, other implementations of the invention can include insulator stripe top contacts, as shown in FIG. 13, and/or double top contacts, as shown in FIG. 14.

The insulator stripe top contacts include a p-metal layer 34 and an insulator layer 36 that isolates individual devices. The double top contact includes a n-metal layer 38, p-metal layer 40, and an insulator layer 42. In the case of double top contacts, the graded buffer would no longer need to be doped. Both of these contact schemes would lead to improved emission. In particular, the double top contact would allow light extraction from the entire backside of the device.

Figure 13:
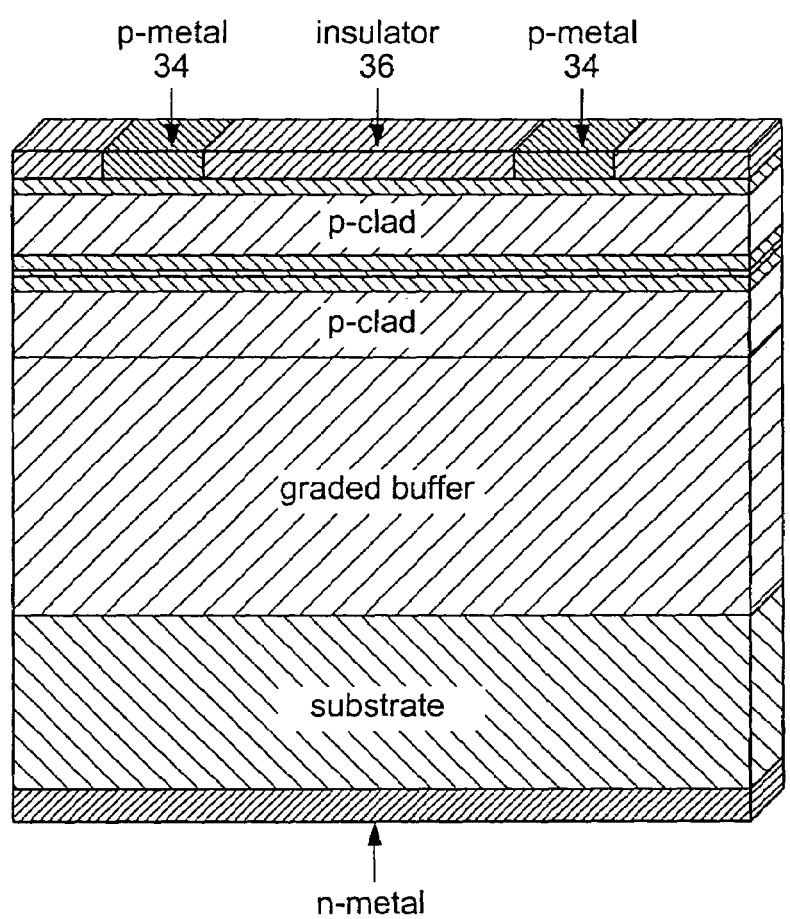
FIG. 13 is a schematic block diagram of another embodiment of the invention having an oxide stripe top contact.
Figure 14:
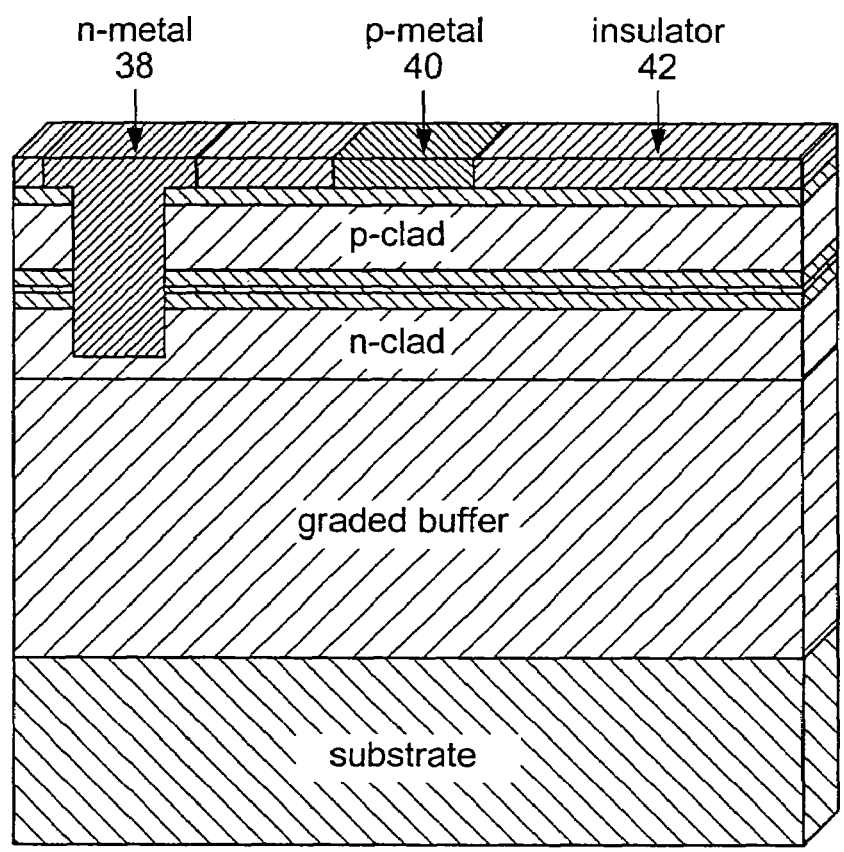
FIG. 14 is a schematic block diagram of another embodiment of the invention having an double top contact.

The improved contacts shown in FIGS. 13 and 14 should also make it possible for the device to act as a laser.

The demonstrated devices described herein are produced using metal-organic chemical vapor deposition, however, device operation need not depend on deposition method. Likewise, for the contacts, various metals and deposition methods can be used.

The invention presents a novel visible light emitting device design based on the InAlGaP system. This design is theoretically capable of accessing wavelengths from 540 nm (green) to 590 nm (yellow), and is epitaxially integrated on a fully transparent substrate. To date, the best LED fabricated using this design had a bulk threading dislocation density of $7\times10^6$ cm$^{-2}$ and operated at a power of 0.18 µW per facet at 20 mA with a peak wavelength of 590 nm and a secondary peak wavelength of 560 nm. While this output power is relatively low, nonideal doping and contacting of the devices likely detracted from their performance and can be improved. Characteristic emission wavelengths of the devices were longer than predicted. Devices with a quantum well composition of $In_{0.32}Ga_{0.68}P$ were particularly affected, showing only a weak peak at the desired 560 nm wavelength and a stronger peak at 590 nm. It is believed that this discrepancy arises from ordering in the quantum well active region, as observed by electron diffraction. Output power of devices with identical active regions was found to decrease by approximately a factor of two as threading dislocation density increased by an order of magnitude. Indium fraction in the quantum well did not have a large impact on device power.

The invention can be used in improving electrical characteristics and reducing the bulk threading dislocation density in the devices in order to maximize efficiency and brightness. The $7\times10^6$ cm$^{-2}$ threading dislocation density observed, in samples graded at −0.4% strain/micron, is nearly an order of magnitude higher than threading densities obtained in the past for graded buffers of the same composition. The dislocation multiplication mechanisms in our structure have been identified and we believe they can be mitigated in the next generation of devices, leading to reduced dislocation density and improved performance. It has been observed that industrially produced InAlGaP graded buffers have a low threading dislocation density in the mid-$10^5$ cm$^{-2}$ range, so transfer of device growth to a production reactor would immediately improve device performance. Finally, ordering in the quantum well must be suppressed in order to recover the observed 560 nm emission as the peak wavelength of devices with a quantum well composition of $In_{0.32}Ga_{0.68}P$. A careful optimization of parameters such as growth rate and V/III ratio during quantum well deposition should eliminate the detrimental ordering.

Although the present invention has been shown and described with respect to several preferred embodiments thereof, various changes, omissions and additions to the form and detail thereof, may be made therein, without departing from the spirit and scope of the invention.

What is claimed is:

1. A light-emitter structure comprising:
   a platform;
   an $In_x(Al_yGa_{1-y})_{1-x}P$ lower clad region formed on said platform and having a lattice constant between approximately 5.49 Å and 5.62 Å;
   a strained quantum well active region formed on said lower clad region; and
   an $In_x(Al_yGa_{1-y})_{1-x}P$ upper clad region formed on said strained quantum well active region.

2. The light-emitter structure of claim 1, wherein said strained quantum well active region comprises an $In_x(Al_yGa_{1-y})_{1-x}P$ strained quantum-well active region where $0.27 \leq x \leq 0.50$ and $0 \leq y \leq 1$ formed on said lower clad region.

3. The light-emitter structure of claim 1, wherein said upper clad region is approximately lattice-matched to said lower clad region formed on said strained quantum well.

4. The light-emitter structure of claim 1, wherein said platform comprises a $\nabla_x[In_x(Al_yGa_{1-y})_{1-x}P]$ graded buffer placed between a substrate and said lower clad region.

5. The light-emitter structure of claim 4, wherein said substrate comprises GaP.

6. The light-emitter structure of claim 1 further comprising a cap layer that is deposited on said upper clad region.

7. The light-emitter structure of claim 6, wherein said cap layer comprises InGaP that is deposited on and approximately lattice-matched to said upper clad region.

8. The light-emitter structure of claim 1 further comprising separate confinement heterostructures (SCH) placed between said upper clad region, said lower clad region and said strained quantum well active region.

9. The light-emitter structure of claim 8, wherein said separate confinement heterostructures (SCH) comprises InGaP or InAlGaP that is approximately lattice-matched to said clad layer, and placed between said upper clad region, lower clad region and said strained quantum well active region.

10. The light-emitter structure of claim 1, wherein said upper and lower clad regions comprise concentration values x=0.22 and y=0.2.

11. The light-emitter structure of claim 1, wherein said strained quantum well active region comprises concentration values x=0.32 and y=0.

12. The light-emitter structure of claim 1, wherein said lower clad region and upper clad region are n-doped and p-doped, respectively.

13. The light-emitter structure of claim 1, wherein said lower clad region and upper clad region are p-doped and n-doped, respectively.

14. The light-emitter structure of claim 4, wherein said $\nabla_x[In_x(Al_yGa_{1-y})_{1-x}P]$ graded buffer and said lower clad region are n-doped, and said upper clad is p-doped.

15. The light-emitter structure of claim 4, wherein said $\nabla_x[In_x(Al_yGa_{1-y})_{1-x}P]$ graded buffer and said lower clad region are p-doped, and said upper clad is n-doped.

16. The light-emitter structure of claim 4, wherein said $\nabla_x[In_x(Al_yGa_{1-y})_{1-x}P]$ graded buffer is undoped, said lower clad region is n-doped, and said upper clad region is p-doped.

17. The light-emitter structure of claim 4, wherein said $\nabla_x[In_x(Al_yGa_{1-y})_{1-x}P]$ graded buffer is undoped, said lower clad region is p-doped, and said upper clad region is n-doped.

18. The light-emitter structure of claim 1, wherein said strained quantum well active region is doped.

19. The light-emitter structure of claim 8, wherein said SCH structures are doped.

20. The light-emitter structure of claim 1 further comprising a double top contact.

21. The light-emitter structure of claim 1 further comprising an insulator stripe top contact.

22. The light-emitter structure of claim 1, wherein said platform comprises a substrate that is lattice-matched to said lower clad region.

* * * * *